United States Patent [19]
Gruender, Jr. et al.

[11] Patent Number: 5,535,367
[45] Date of Patent: Jul. 9, 1996

[54] DEMULTIPLEXING INITIALIZATION DATA TO BE TRANSFERRED TO MEMORY THROUGH A PLURALITY OF REGISTERS WITH ERROR DETECTION DATA

[75] Inventors: Eugene H. Gruender, Jr.; Ralph E. Snowden, both of Austin, Tex.

[73] Assignee: Motorola, Inc., Schaumburg, Ill.

[21] Appl. No.: 214,083

[22] Filed: Mar. 16, 1994

Related U.S. Application Data

[63] Continuation of Ser. No. 683,537, Mar. 4, 1991, abandoned.

[51] Int. Cl.$^6$ ............................................. G06F 9/00
[52] U.S. Cl. .................. 395/493; 327/198; 395/182.21; 364/724.02
[58] Field of Search .................. 395/425, 575, 395/493, 182.21, 482; 364/200, 265.3, 280.2, 265.3, 265, 717/717.5, 724.02, 580; 371/37.7, 40.4, 3; 380/21; 327/198

[56] References Cited

U.S. PATENT DOCUMENTS

| | | | |
|---|---|---|---|
| 3,651,315 | 3/1972 | Collins | 364/580 |
| 4,266,272 | 5/1981 | Berglund et al. | 395/482 |
| 4,322,791 | 3/1982 | Ishii | 395/181 |
| 4,543,559 | 9/1985 | Guillou et al. | 341/50 |
| 4,608,688 | 8/1986 | Hansen et al. | 395/182.04 |
| 4,694,431 | 9/1987 | Miyamura et al. | 365/95 |
| 4,744,080 | 5/1988 | Brennan et al. | 380/21 |
| 4,748,576 | 5/1988 | Beker et al. | 364/717 |
| 4,831,513 | 5/1989 | Kanazawa | 395/493 |
| 4,875,209 | 10/1989 | Mathewes, Jr. et al. | 371/3 |

*Primary Examiner*—Tod R. Swann
*Assistant Examiner*—James Peikari
*Attorney, Agent, or Firm*—S. Kevin Pickens

[57] ABSTRACT

Initialization data is received by a memory multiplexer (MEMMUX) and stored in a plurality of registers of the MEMMUX without reading data from memory. The storage of the initialization data in the MEMMUX registers may be sequential or simultaneous. The initialization data is then written to memory along with error detection and correction data as desired.

4 Claims, 4 Drawing Sheets

DEMULTIPLEXING INITIALIZATION DATA TO BE TRANSFERRED TO MEMORY THROUGH A PLURALITY OF REGISTERS WITH ERROR DETECTION DATA

This application is a continuation of prior application Ser. No. 07/663,537 filed Mar. 4, 1991, now abandoned.

FIELD OF THE INVENTION

The present invention relates, in general, to memory devices and, more particularly, to a method for initializing a memory device.

1. Background of the Invention

Currently, at power-up and during other functions, the memory in a system is initialized. This initialization places the memory in a known state by storing known data into the memory device.

As the size of memory has grown, this process has taken more and more time to accomplish. In addition, the use of larger data processing busses (e.g. 32 bit, 64 bit, etc.) in conjunction with devices operating at some fraction of the time of the bus width, has further added to the time that this process requires to be accomplished.

2. Summary of the Invention

A method of initializing a memory device is described. The method receives an initialization data word which is stored in memory. The initialization data word is stored in each of a plurality of registers in a memory multiplexer (MEMMUX). A plurality of initialization data words (one from each register) is then written to the memory device.

DETAILED DESCRIPTION OF THE DRAWINGS

Figure 1:
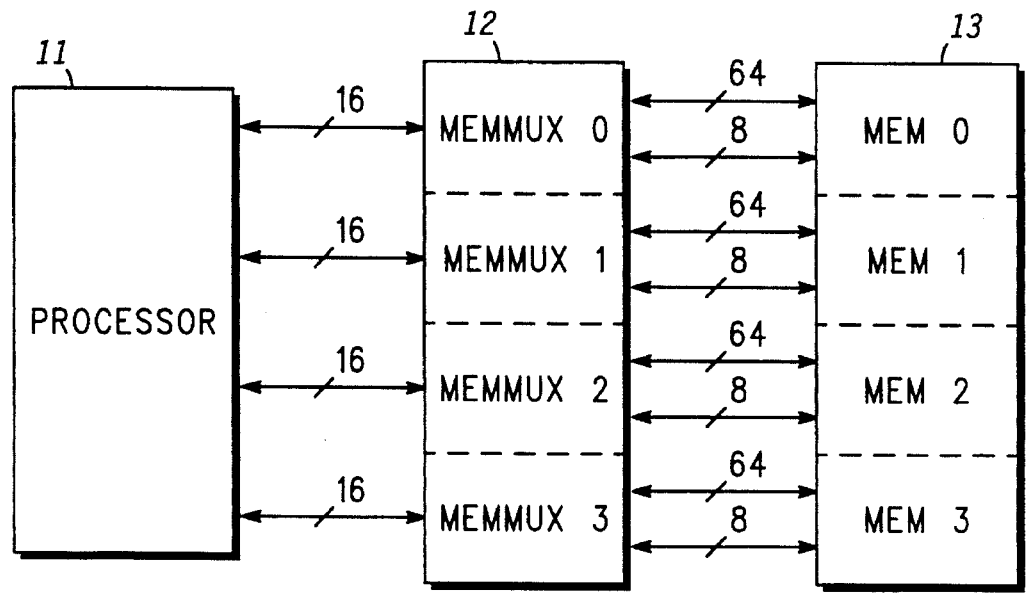
FIG. 1 is a general block diagram of a system which utilizes a method in accordance with a preferred embodiment of the present invention.

Referring initially to FIGS. 1, a block diagram of a system, generally designated 10, utilizing the present invention, is illustrated. System 10 consists primarily of a data processor 11, memory multiplexers (MEMMUX) 12, and memory devices 13. It should be noted that, for the present invention, data may be received from any source, even direct user input, not: just data processor 11. In addition, while device 12 is generally referred to as a multiplexer, it is actually a multiplexer/demultiplexer and, for the present invention, only the demultiplexing function is utilized.

In general operation, when data is requested it is read from memory 13 and loaded into MEMMUX 12 in 64 bit segments plus an 8 bit correction word. The data is then transfered to processor 11 in 16 bit segments.

As illustrated in FIG. 1, four MEMMUXs and a number of memory devices are used to provide a total data bus width of 64 bits between processor 11 and MEMMUX 12 and 288 bits between MEMMUX 12 and memory 13.

In a normal read-modify-write operation, data is read from memory 13 and stored in registers in MEMMUX 12. Prior to being stored in the registers, the data is verified using the check bits transfered with the data. This verification may be parity checking, error detection and correction (EDAC), or some other form of data verification. The new data to be stored in memory 13 is received from processor 11 and stored in the appropriate register in MEMMUX 12. The register data is then transfered to memory 13. During this transfer step, new verification data is generated to be stored with the data.

As an example, if word 2 was to be modified, words 1–4 would be read out of memory 13 and stored in MEMMUX 12, after being verified. Word 2 would then be modified. New verification data is generated and words 1–4 with the verification data are written to memory 13.

At various times, such as start-up, it is desirable to have the data in memory 13 set to a known state. One prior art process, generally designated 20, of initializing memory is shown in the flow chart of FIG. 2. The process commences when a command is received to initialize the memory, step 21. A first initialization data word is received which is addressed to word 1 (step 22). This process assumes a four word MEMMUX is used such as in FIG. 1. The data corresponding to the address for word 1 and words 2–4 is retrieved from memory, step 23. The initialization data word is then stored in MEMMUX register 1, step 24. The data in registers 1–4 is then written back to memory, step 25.

Next, a second initialization data word is received addressed to word 2, step 26. Again, the data corresponding to the addresses 1–4 is read from memory, step 27. The initialized data word is stored in MEMMUX register 2, step 28. The data in registers 1–4 is then written back to memory, step 29.

This same process is then repeated for words 3 and 4 as set out in steps 30–37. Once all four words have been initialized, the process will either start on the next set of four words or, once all of the memory is initialized, the process will end, step 38.

Figure 3:
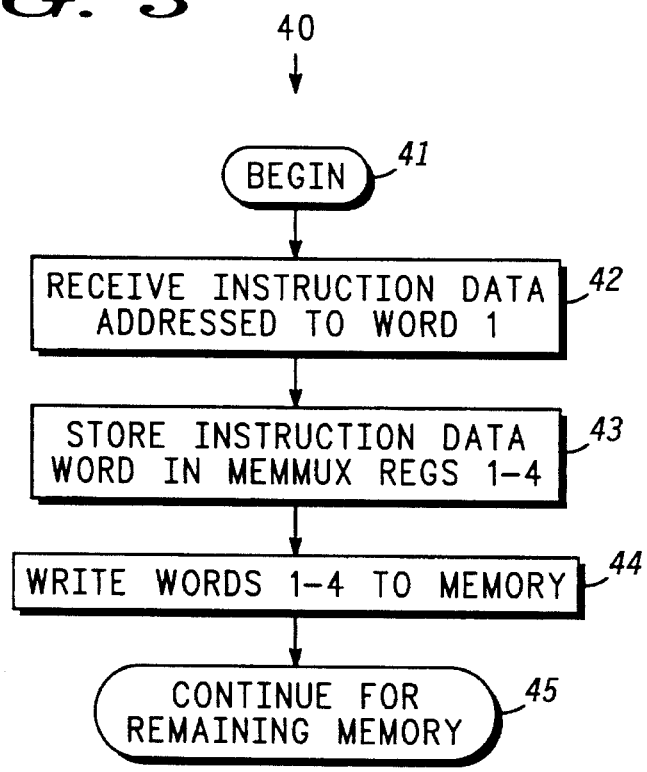
FIG. 3 is a flow diagram of an initialization process in accordance with a preferred embodiment the present invention.

Referring now to FIG. 3, a flow chart of an intialization process, generally designated 40, representing the present invention is illustrated. Process 40 begins at step 41 with the activation of the initialization procedure. An initialization data word is received addressed to word 1, step 42. This data is stored in all four of the registers of MEMMUX 12, step 43. The initialization data is then written to memory, step 44. This procedure will continue, step 45, until all of the memory is initialized.

As can be seen from a comparison of the two procedures, a method of initializing memory in accordance with the present invention can accomplish the transfer of initialization data into MEMMUX 12 in one-fourth the steps needed in the prior art method. This translates into a substantial savings in time while reaching the same result.

Figure 4A:
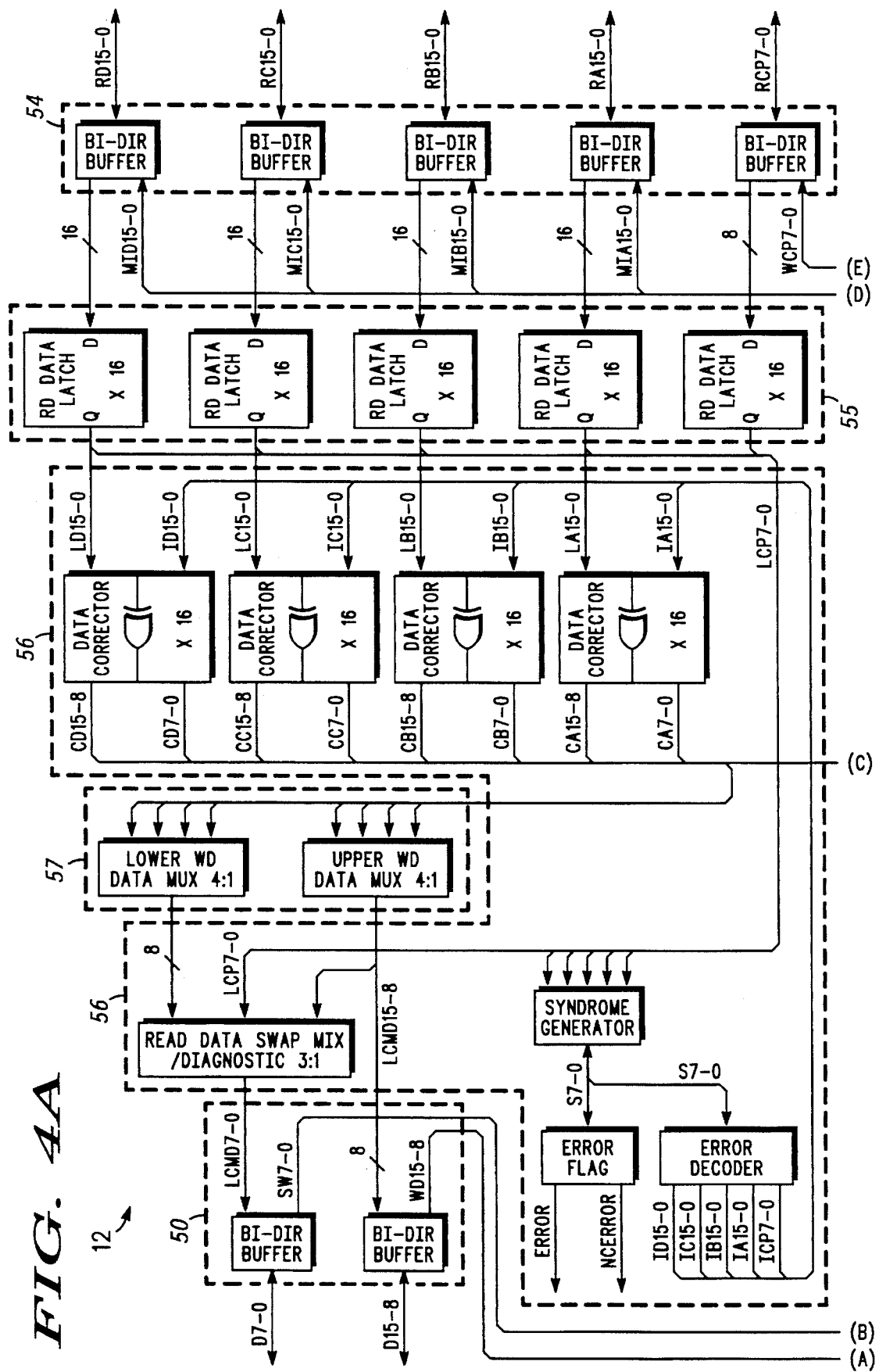
FIGS. 4A and 4B provide a more detailed block diagram of a MEMMUX of FIG. 1.
Figure 4B:
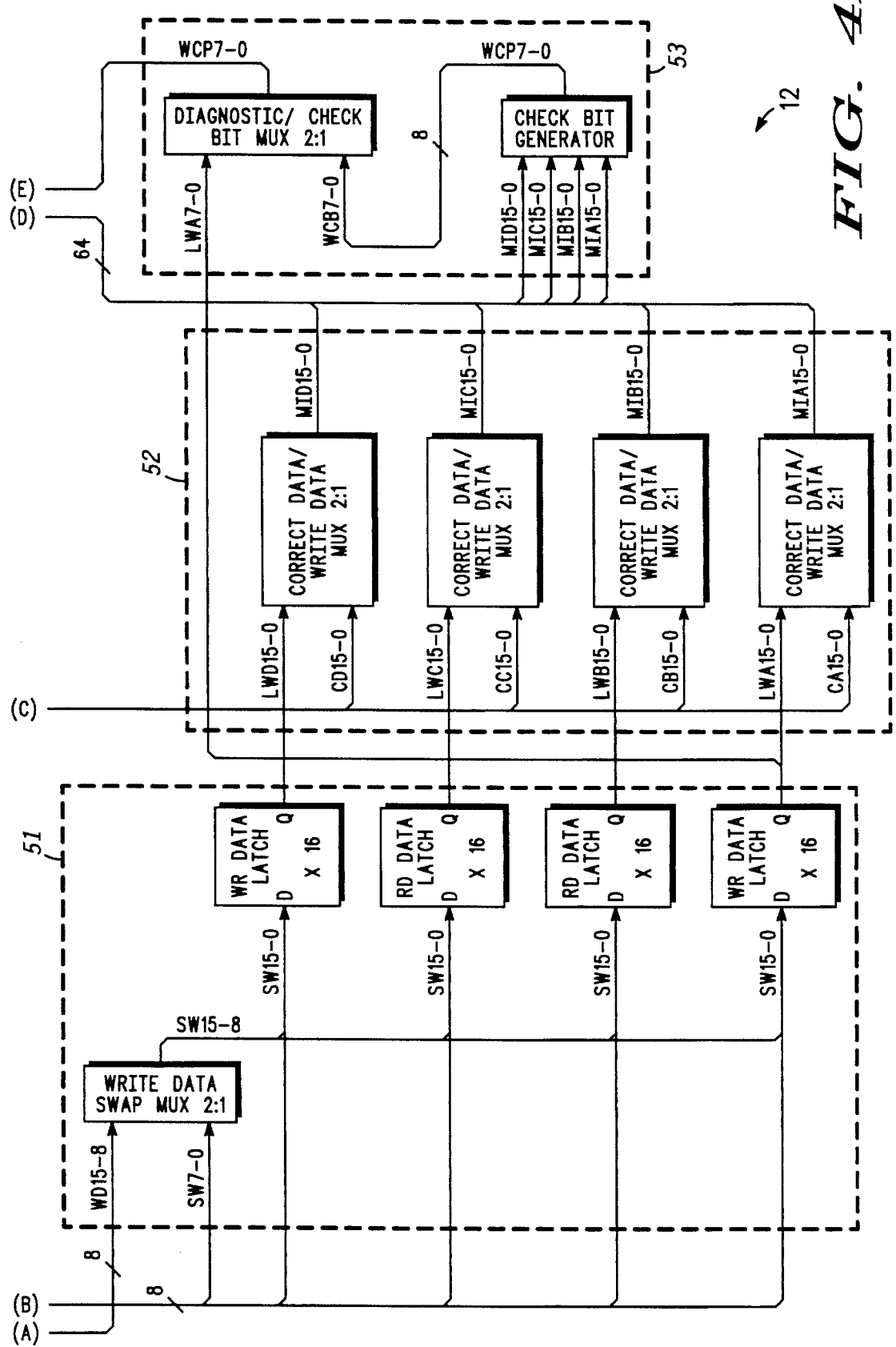

In FIGS. 4A and 4B, a more detailed diagram of the structure of MEMMUX 12 is provided. MEMMUX 12 consists essentially of a set of bi-directional buffers 50 on the processor side; a set of write data latches and related circuitry 51; a set of write data multiplexers 52; check bit generator circuitry 53; and a set of bi-directional buffers 54 on the memory side. On the read side, in addition to buffers 54 and 50, MEMMUX 12 consists of: read data latches 55; error detection and correction circuitry 56; and read data multiplexers 57.

Figure 2:
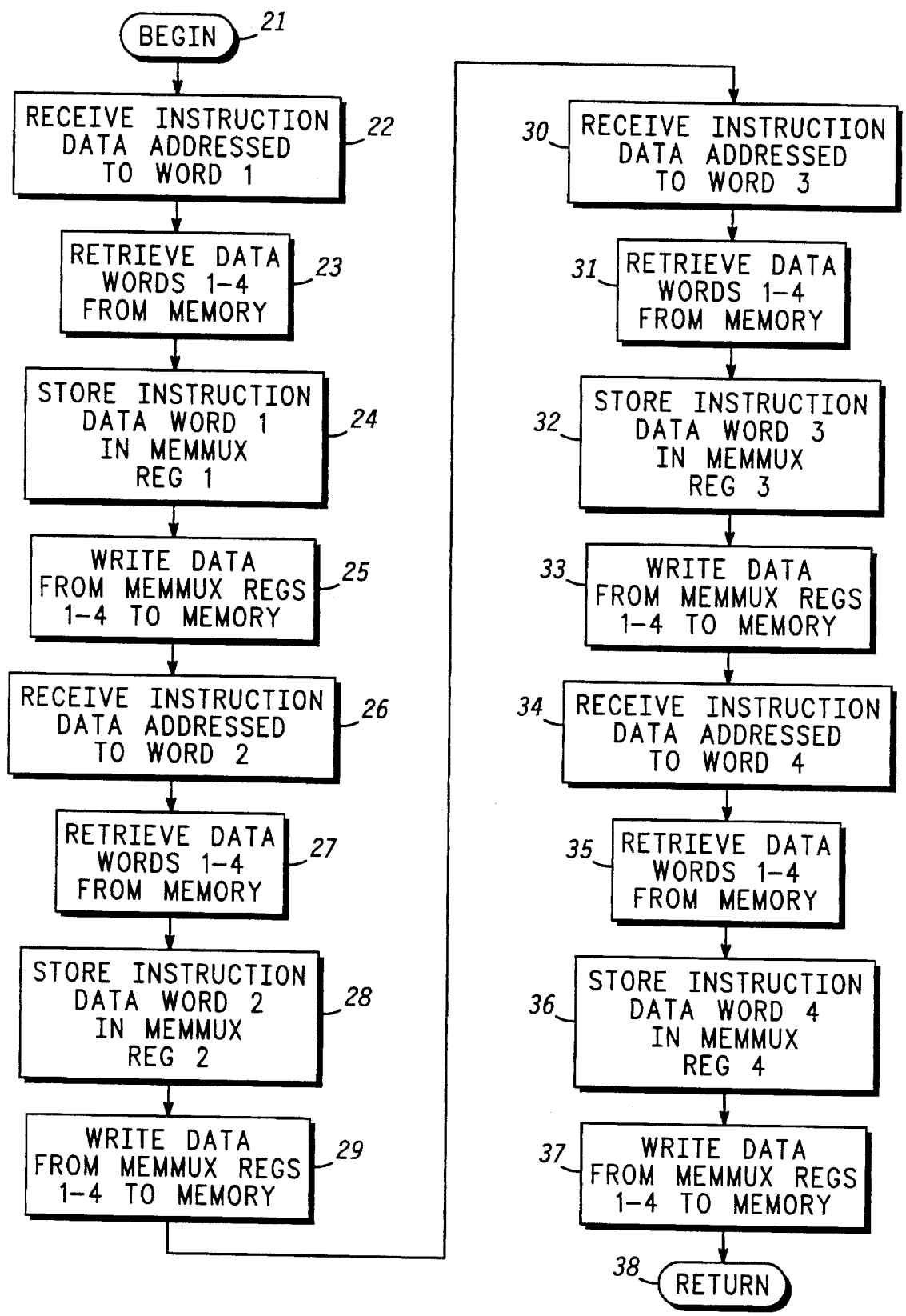
FIG. 2 is a flow diagram of a prior art initialization process.

In prior art power-up initialization vis-a-vis FIG. 2, initialization data addressed to word 1 is received at buffers 50 and stored in the appropriate write data latch of circuitry 51. The data stored in the memory for words 1–4 is retrieved and received at buffers 54. The retrieved data is passed to write multiplexers 52 where the initialization data is substituted for the retrieved word 1 data. Words 1–4 are then: passed through check bit generator 53; passed through buffers 54; and written in memory.

Word 2 initialization data is then received. The data stored in the memory for words 1–4 is again retrieved and received at buffers 54. The retrieved data is passed to write multiplexers 54 where the initialization data is substituted for the retrieved word 2 data. Words 1–4 are then: passed through check bit generator 53; passed through buffers 54; and written to memory.

This process is then repeated for words 3 and 4 for each set of four words in memory.

A major problem in this process arises from error detection and correction circuitry 56. Upon power-up, the data stored in memory is a series of random data. That is the reason for performing an initialization. However, along with the regular data being random, the error correction and detection data is also random. Therefore, when a word is read following power-up, an error will be reported.

In a preferred embodiment of the present invention, an initialization data word is received for word 1 at buffers 50. This initialization data is then written to the first data latch of circuitry 51. The same data is then written to the second latch, the third latch, and finally the fourth latch. This initialization data is then: passed through check bit generator 53; passed through buffers 54; and written to memory.

As described above, the present invention can substantially reduce the steps and decrease the time necessary to accomplish the initialization process. In addition, because the random data is not read from memory, no data errors appear due to random data correction bits stored in memory.

In another embodiment of the present invention, the initialization data received for word 1 is written simultaneously to registers 1–4. This data is then written to memory. Again, this provides a substantial time savings as compared with the prior art method and also saves time as compared with the first embodiment of the present invention as set out above.

Thus, it will be apparent to one skilled in the art, upon reviewing the foregoing description, that there has been provided in accordance with the invention, a device that fully satisfies the objects, aims, and advantages.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method of initializing a memory in a computer system, the computer system having multiple registers provided for holding data words stored in the memory at sequential memory addresses, and the method comprising the steps of:

reading into the multiple registers a group of data words stored in the memory at a group of the sequential memory addresses;

modifying a single data word of the group of data words to become an initialization data word;

storing the initialization data word in each of the multiple registers; and writing the initialization data word stored in each of the multiple registers to the memory at the group of sequential memory addresses.

2. The method of claim 1 wherein the step of storing the initialization data word comprises storing the initialization data word in each of the multiple registers simultaneously.

3. A method of initializing a memory in a computer system, the computer system having multiple demultiplexers provided for holding data words stored in the memory at sequential memory addresses, and the method comprising the steps of:

reading into the multiple demultiplexers a group of data words stored in the memory at a group of the sequential memory addresses;

modifying a single data word of the group of data words to become an initialization data word;

storing the initialization data word in each of the multiple demultiplexers; and writing the initialization data word stored in each of the multiple demultiplexers to the memory at the group of sequential memory addresses.

4. The method of claim 3 wherein the step of storing the initialization data word comprises storing the initialization data word in each of the multiple demultiplexers simultaneously.

* * * * *